(12) United States Patent
Kwak

(10) Patent No.: US 10,355,689 B2
(45) Date of Patent: Jul. 16, 2019

(54) TOUCH SWITCH UNIT AND INTERIOR LIGHTING APPARATUS FOR VEHICLE INCLUDING THE SAME

(71) Applicant: LS AUTOMOTIVE CORP, Ansan-si, Gyeonggi-do (KR)

(72) Inventor: Byoung Hoon Kwak, Hwaseong-si (KR)

(73) Assignee: LS AUTOMOTIVE TECHNOLOGIES CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/743,225

(22) PCT Filed: Oct. 20, 2016

(86) PCT No.: PCT/KR2016/011821
§ 371 (c)(1),
(2) Date: Jan. 9, 2018

(87) PCT Pub. No.: WO2017/073954
PCT Pub. Date: May 4, 2017

(65) Prior Publication Data
US 2018/0212603 A1    Jul. 26, 2018

(30) Foreign Application Priority Data
Oct. 30, 2015 (KR) .................. 10-2015-0152115

(51) Int. Cl.
*H03K 17/96* (2006.01)
*B60Q 3/82* (2017.01)
*B60Q 3/74* (2017.01)

(52) U.S. Cl.
CPC ............. *H03K 17/962* (2013.01); *B60Q 3/74* (2017.02); *B60Q 3/82* (2017.02);
(Continued)

(58) Field of Classification Search
CPC ......... H03K 17/962; H03K 2017/9602; H03K 2217/96; H03K 2217/96077; H03K 2217/96079; B60Q 3/82; B60Q 3/74
(Continued)

(56) References Cited

U.S. PATENT DOCUMENTS 5,917,165 A *  6/1999  Platt .................. H03K 17/962
                                                200/511
7,232,973 B2 * 6/2007  Kaps .................. H03K 17/962
                                                200/600
(Continued)

FOREIGN PATENT DOCUMENTS

EP     2 876 196 A1    5/2015
JP    2008-305766 A   12/2008
(Continued)

*Primary Examiner* — Edwin A. Leon
(74) *Attorney, Agent, or Firm* — Rabin & Berdo, P.C.

(57) ABSTRACT

The present invention provides a touch switch unit, including a touch knob 400 on which a touch by a user is performed, a board 200 spaced apart from the touch knob, and a touch electrode body 500 interposed between the board and the touch knob 400, for sensing a change in an electrical signal according to a touch on the touch knob, wherein the touch electrode body 500 includes a touch body 510 fixed on one surface of the board 200 between the touch knob and the board and a touch sensing electrode 520 having at least part extended to an area adjacent to the touch knob and an area adjacent to the board and formed on the touch body 510 through insert injection and having at least another part formed on the board 200 and a vehicle lighting device including the touch switch unit.

8 Claims, 11 Drawing Sheets

(52) U.S. Cl.
CPC .  *H03K 2017/9602* (2013.01); *H03K 2217/96* (2013.01); *H03K 2217/96077* (2013.01); *H03K 2217/96079* (2013.01)

(58) Field of Classification Search
USPC ......................................................... 200/600
See application file for complete search history.

(56) References Cited

U.S. PATENT DOCUMENTS

| | | | |
|---|---|---|---|
| 7,786,400 B2* | 8/2010 | Baier | F24C 7/082 |
| | | | 200/511 |
| 8,110,767 B2* | 2/2012 | Yamauchi | H03K 17/962 |
| | | | 200/600 |
| 2010/0238677 A1 | 9/2010 | de Laine et al. | |
| 2011/0182458 A1 | 7/2011 | Rosener et al. | |
| 2014/0016046 A1 | 1/2014 | Zarcone | |

FOREIGN PATENT DOCUMENTS

| | | |
|---|---|---|
| JP | 2010-123470 A | 6/2010 |
| JP | 2011-165384 A | 8/2011 |
| JP | 2012-061997 A | 3/2012 |
| JP | 2014-235894 A | 12/2014 |
| KR | 10-1198497 B1 | 11/2012 |
| WO | WO-2009/089092 A1 | 7/2009 |

\* cited by examiner

TOUCH SWITCH UNIT AND INTERIOR LIGHTING APPARATUS FOR VEHICLE INCLUDING THE SAME

TECHNICAL FIELD

The present invention relates to a switch mounted on a vehicle and, more particularly, to a switch unit, which minimizes a capacitive switch production cost and which is more accurate and secures scalability, and an interior lighting apparatus for a vehicle including the same.

BACKGROUND ART

In general, a room lamp for a vehicle has been developed from a simple form that provides light within a vehicle to a touch type switch which can be easily manipulated in order to provide safe and comfortable driving to a driver and a passenger.

For example, the touch type switch uses capacitance and has a function that is enabled when a user's finger simply comes into contact with the touch type switch without pressing or rotating it. In the case of a room lamp installed on the overhead console of a driver's seat, a switch button (icon) for turning on or off the room lamp is formed on a surface of a lens.

However, a conventional capacitive touch method has many advantages compared to an existing manipulation method using a mechanical switch, but is problematic in that a device on which a touch is performed and a printed circuit board must be closely attached so that an air layer is not present therebetween. Accordingly, the conventional capacitive touch method has a limit to a mechanical structure and a limit to the spatial design in order to implement a function as a touch switch.

Furthermore, high cost methods for wiring between a board in which electrodes are disposed and a main board for an electrical connection between an electrode portion on which a touch is performed and the underlying board, an electrical connection using a flexible board between a touch film and a main board, and an electrical connection using a pin header soldering method between a board in which electrodes are disposed and a main board (refer to FIGS. 1 to 3) are used.

DISCLOSURE

Technical Problem

Accordingly, the present invention has been made in view of the above problems, and it is an object of the present invention to provide a touch switch unit which secures a low cost, high efficiency and high reliability through a compact and simple structure and an interior lighting apparatus for a vehicle including the same.

Technical Solution

According to an aspect of the present invention, the present invention provides a touch switch unit, including a touch switch unit, including a touch knob 400 on which a touch by a user is performed, a board 200 spaced apart from the touch knob, and a touch electrode body 500 interposed between the board and the touch knob 400, for sensing a change in an electrical signal according to a touch on the touch knob, wherein the touch electrode body 500 includes a touch body 510 fixed on one surface of the board 200 between the touch knob and the board and a touch sensing electrode 520 having at least part extended to an area adjacent to the touch knob and an area adjacent to the board and formed on the touch body 510 through insert injection and having at least another part formed on the board 200.

In the touch switch unit, the touch sensing electrode may comprise: a touch sensing electrode main part 521 having at least part of one surface thereof spaced apart from the touch knob 400 and being adjacent to the touch knob 400 toward the touch knob, wherein the touch sensing electrode main part 521 receives a change in the electrical signal in a state in which a user has touched the touch knob, a touch sensing electrode facing part 525 adjacent to and spaced apart from the board 200 in such a way as to be exposed toward the board 200, a touch sensing electrode connection unit 523 having one end connected to the touch sensing electrode main part 521 and the other end connected to the touch sensing electrode facing part 525, and a touch sensing electrode fixing unit 530 formed on one surface of the board 200, for forming electrical communication with the touch sensing electrode facing part 525.

In the touch switch unit, the touch sensing electrode facing part 525 and the touch sensing electrode fixing unit 530 may be closely disposed in a contactless manner.

In the touch switch unit, the touch sensing electrode facing part 525 and the touch sensing electrode fixing unit 530 may form a mutual contact structure, and one end of the touch sensing electrode facing part 525 is connected to the touch sensing electrode connection unit 523 and the other end of the touch sensing electrode facing part 525 comes into contact with the touch sensing electrode fixing unit 530.

In the touch switch unit, the touch body may comprise: a touch body top part 511 disposed to face the touch knob, a touch body main part 513 disposed on one surface toward the board of the touch body top part 511 and having a touch sensing electrode facing part 525 disposed on the one surface toward the board, and a touch body space part 515 disposed outside the touch body main part 513, partitioned by the touch body main part and having one end open toward the board.

The touch switch unit may further comprise a touch light output unit being capable of outputting light toward the touch knob and being disposed on one surface toward the touch body space part 515 of surfaces of the board.

In the touch switch unit, the touch body may comprise a touch body top part 511 disposed to face the touch knob and a touch body main part 513 disposed on one surface toward the board of the touch body top part 511, the touch sensing electrode facing part 525 being disposed on the one surface toward the board, and the touch sensing electrode connection unit is disposed within the touch body.

According to the other aspect of the present invention, the present invention provides an interior lighting apparatus for a vehicle comprising a touch switch unit, the touch switch unit comprising: a touch knob 400 on which a touch by a user is performed; a board 200 spaced apart from the touch knob; and a touch electrode body 500 interposed between the board and the touch knob 400, for sensing a change in an electrical signal according to a touch on the touch knob. The touch electrode body 500 may comprise a touch body 510 fixed on one surface of the board 200 between the touch knob and the board, and a touch sensing electrode 520 having at least part extended to an area adjacent to the touch knob and an area adjacent to the board and formed on the touch body 510 through insert injection and having at least another part formed on the board 200.

Advantageous Effects

In accordance with the present invention, there can be provided the touch switch unit which secures a low cost, high efficiency and high reliability through a compact and simple structure and the interior lighting apparatus for a vehicle including the same.

MODE FOR INVENTION

Figure 1:
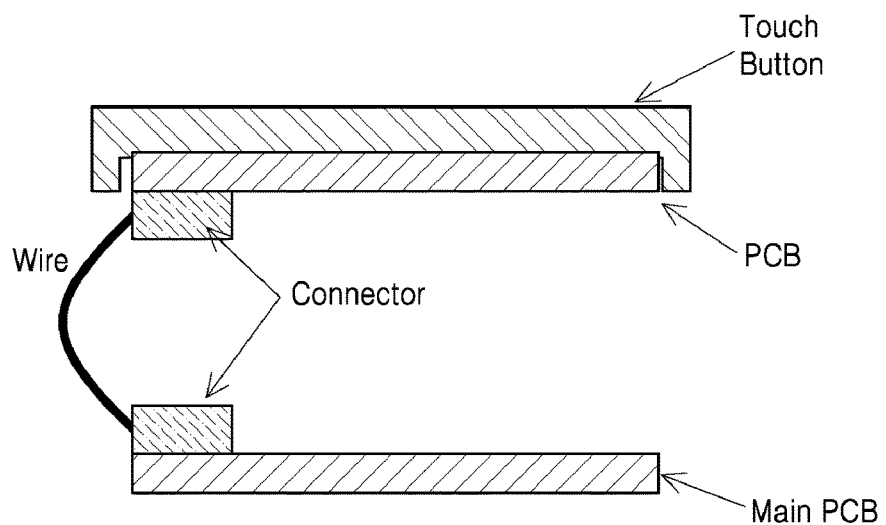
FIGS. 1 to 3 are schematic diagrams showing a schematic connection state of a conventional capacitive switch.
Figure 2:
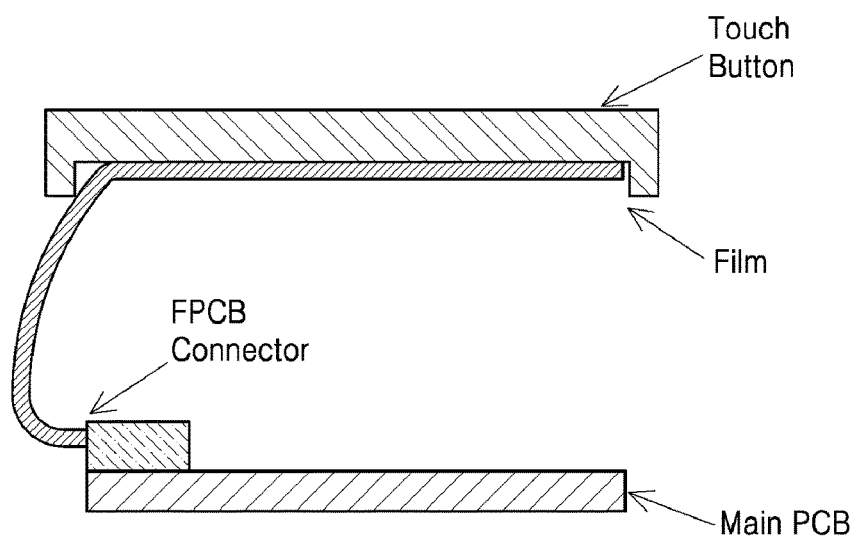
Figure 3:
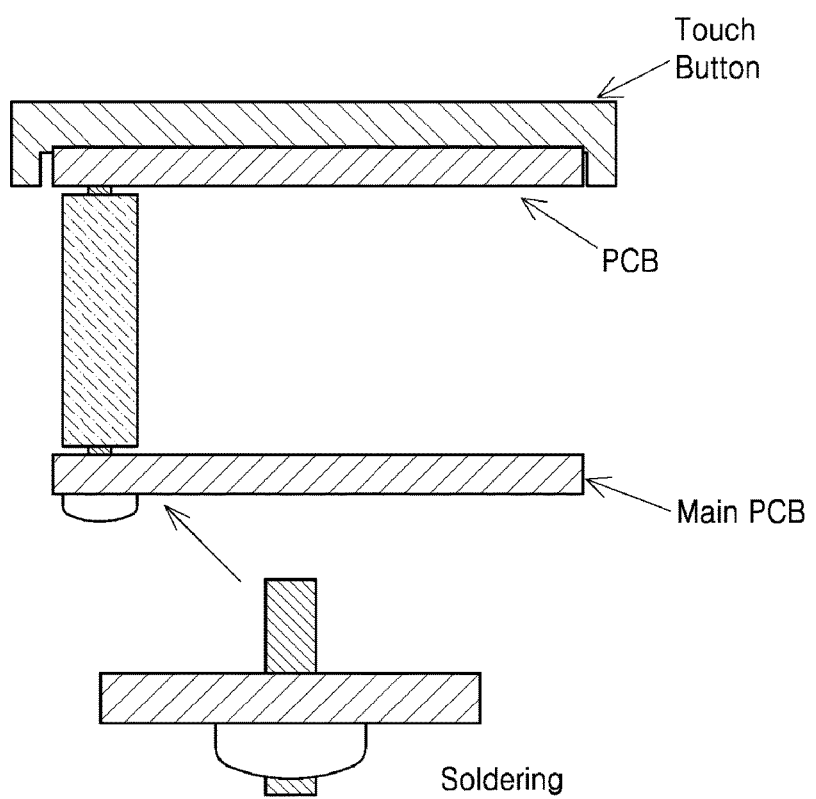

Hereinafter, the configuration and operation of a touch switch unit and an interior lighting apparatus including the same of the present invention will be described in detail with reference to the accompanying drawings.

A touch switch unit 100 of the present invention may sense a change in the state attributable to a user's touch and output a specific switching signal, and may provide an interior lighting apparatus for a vehicle, which enables a stable manipulation without disturbing front attention through the touch switch unit of the present invention. In the present invention, the touch switch unit is chiefly described.

The touch switch unit 100 of the present invention includes a touch knob 400, a board 200 and a touch electrode body 500. Such elements may be received and disposed in the unit housing (not shown) of the touch switch unit. In some cases, the elements may be directly mounted on the housing of the interior lighting apparatus for a vehicle without a separate touch switch unit.

A physical contact of a user is performed on the touch knob 400. In some cases, the touch knob 400 may be made of a light-transmissive material and may transmit light output by light output units 600, such as LEDs which may be disposed on the lower side of the touch knob. The transmitted light may be radiated to the interior of a vehicle. Furthermore, in some cases, the touch knob 400 may be made of a light-blocking material or subjected to light-blocking surface processing and may operate as a simple switch knob. In some cases, the touch knob 400 may be partially subjected to surface etching through laser etching, and a specific icon may be expressed in the touch knob in order to perform a light display function which enables the location of a switch to be visually checked upon driving at night.

The board 200 is configured to be spaced apart from the touch knob 400 and disposed within the unit housing (not shown). The board 200 may be implemented using a specific printed circuit board or a flexible printed circuit board to form specific electrical communication, and may be modified in various ways within a range that forms a wiring line and connector forming an electrical connection with another electronic device.

The touch electrode body 500 is interposed between the board 200 and the touch knob 400 and senses a change in the electrical signal attributable to a touch on the touch knob 400.

The touch electrode body 500 includes a touch body 510 and a touch sensing electrode 520.

The touch body 510 is fixed to the other surface of the board 200 between the touch knob 400 and the board 200. At least part of the touch sensing electrode 520 is extended to an area adjacent to the touch knob 400 and an area adjacent to the board, and the touch sensing electrode 520 is formed on the touch body 510 through insert-injection. At least another part of the touch sensing electrode 520 is formed on the board 200.

A touch body mounting part 517 is disposed at the end of the touch body 510 on the side of the board 200. The touch body mounting part 517 is configured to be connected with a board mounting part 201 formed in the board 200. The board mounting part 201 may be connected to the touch body mounting part 517 through a separate coupling member 700, such as a screw bolt.

Figure 7:
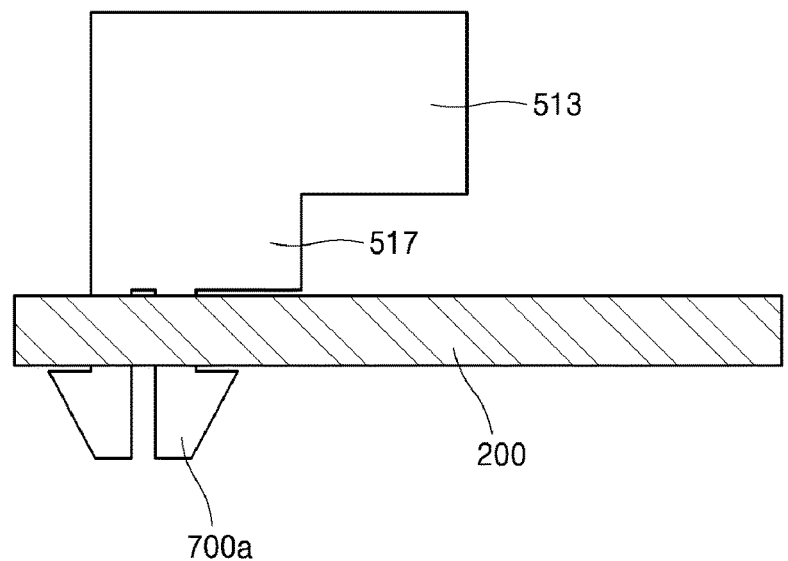
Figure 8:
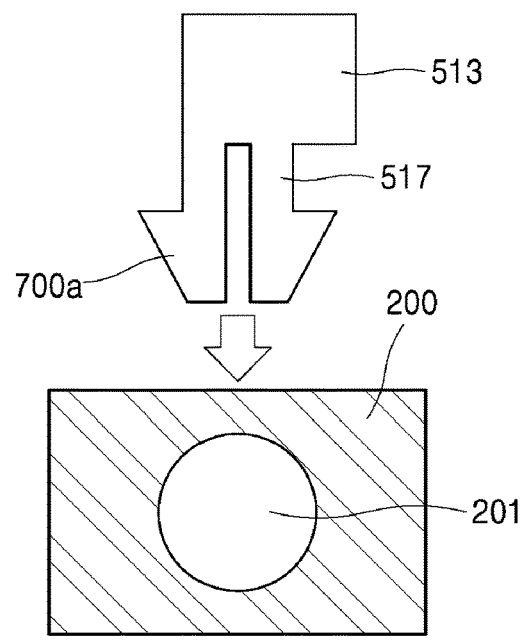
FIG. 8 is a schematic partial enlarged assembly state diagram of the touch switch unit according to the present invention.

In some cases, a coupling hook 700a may be integrated with the touch body mounting part 517. The coupling hook 700a and the touch body mounting part 517 may be coupled together through a structure in which the coupling hook 700a formed at the end of the touch body mounting part 517 is inserted into the board mounting part 201 (refer to FIGS. 7 and 8).

The touch body 510 includes a touch body top part 511 and a touch body main part 513. In the present embodiment, the touch body top part 511 and the touch body main part 513 have been configured to be integrated, but may be defined to be partitioned in a length direction between the board and the touch knob and a direction vertical to the length direction.

The touch body top part 511 has a structure having one surface disposed to face the touch knob 400. The touch body main part 513 is configured to be disposed toward the other surface of the touch body top part 511, that is, toward the board 200 on one surface toward the board 200. A touch sensing electrode facing part 525 to be described later is disposed on the bottom of the touch body main part 513, that is, on one surface toward the board 200.

As shown in the drawings, a gap between the bottom of the touch body main part 513 and the board 200 is divided by a gap between the touch body mounting part 517 and one surface of the board. The bottom of the touch body main part 513 is disposed adjacent to the board 200. In some cases, if the touch sensing electrode facing part 525 of the touch sensing electrode 520 does not come into contact with a touch fixing electrode 530, the touch body main part 513 may be formed so that the touch sensing electrode facing part 525 and the touch fixing electrode 530 become very close to each other for minimum electrical communication them.

In some cases, the touch body 510 may include a touch body space part 515. If the touch body space part 515 is formed, the light output unit 600 may be further provided in the board 200. Light output by the light output unit 600 may be output to the outside through the touch body space part 515 and the touch body top part 511. In this case, for the transmission of the light, the touch body may be made of a light-transmissive material.

A plurality of the touch body main parts that partition the touch body space parts is formed. The touch switch unit has one or more touch functions. If a plurality of the touch functions is integrated, the number of touch body main parts may be one or more larger than the number of touch body space parts as shown in the drawings.

At least part of the touch sensing electrode 520 is extended to an area adjacent to the touch knob 400 and an area adjacent to the board 200. The touch sensing electrode 520 is formed of a wiring line made of a conductive material and formed on the touch body 510 through insert-injection. At least another part of the touch sensing electrode 520 is formed on the board 200.

The touch sensing electrode 520 includes a touch sensing electrode main part 521, the touch sensing electrode facing part 525, a touch sensing electrode connection unit 523 and the touch sensing electrode fixing unit 530.

At least part of one surface of the touch sensing electrode main part 521 is directed toward the touch knob 400, and is adjacent to the touch knob 400 and spaced apart from the touch knob 400. The touch sensing electrode main part 521 receives a change in the electrical signal in the state in which it has come into contact with the touch knob 400 by a user.

The touch sensing electrode facing part 525 is adjacent to the board 200 and spaced apart from the board 200 so that it is exposed toward the board 200.

Figure 5:
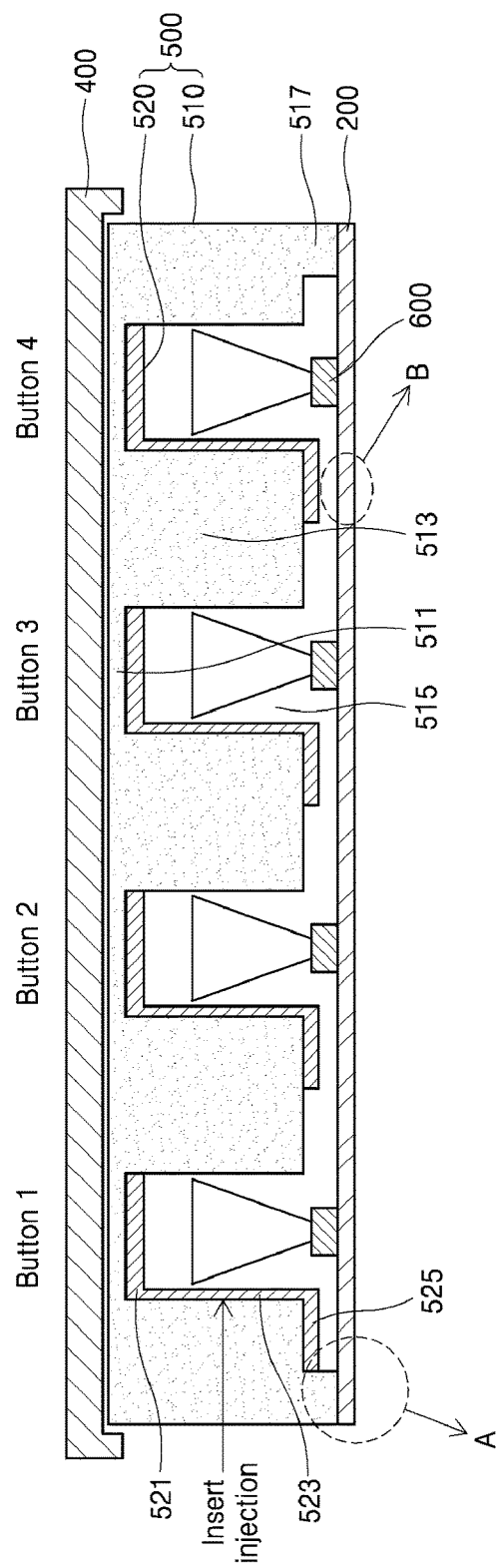
FIGS. 5 to 7 are a schematic partial side view of the touch switch unit according to the present invention and a partial enlarged side cross-sectional view of A of FIG. 5.
Figure 6:
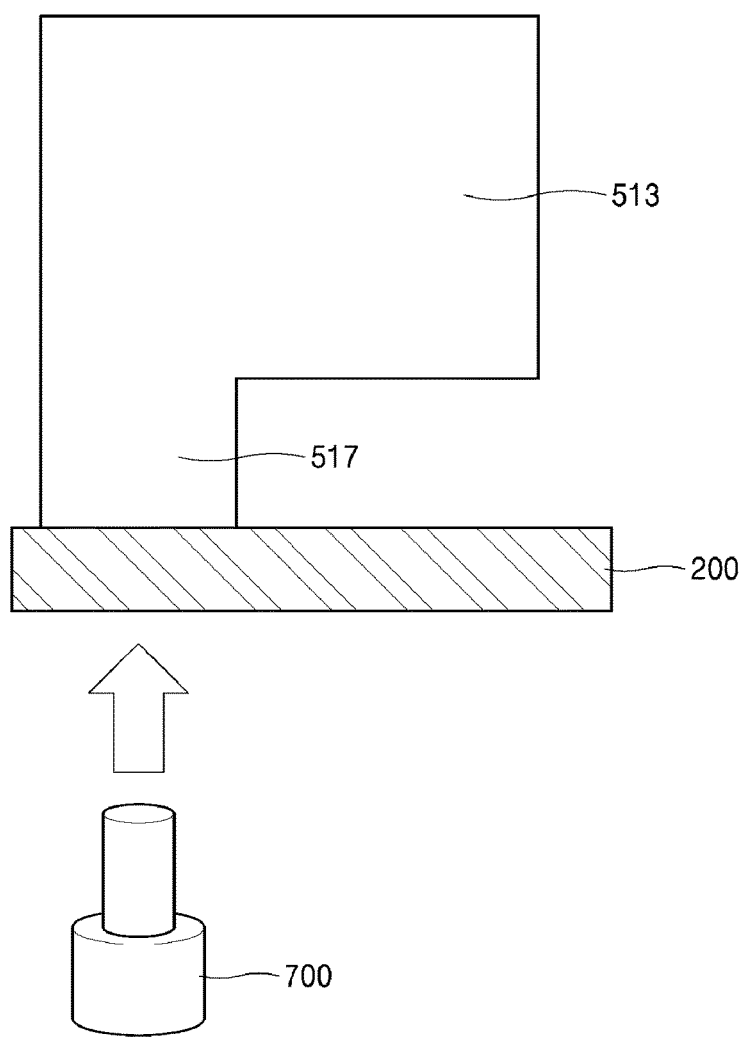

The touch sensing electrode connection unit 523 has one end connected to the touch sensing electrode main part 521 and has the other end connected to the touch sensing electrode facing part 525. In the embodiment of FIG. 5, the touch sensing electrode connection unit 523 has been configured to be formed within the touch body space part. In another embodiment to be described later, the touch sensing electrode connection unit 523 may be directly inserted into the touch body.

The touch sensing electrode fixing unit 530 is formed on one surface of the board 200 and forms electrical communication along with the touch sensing electrode facing part 525. In the case of the embodiment of FIG. 5, the touch sensing electrode facing part 525 is disposed on the bottom surface of the touch body main part 513 and disposed toward the board 200.

Figure 9:
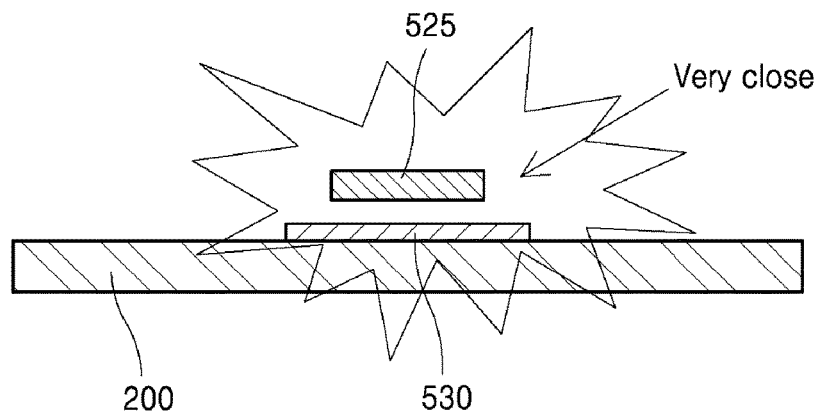
FIGS. 9 and 10 are a partial enlarged side cross-sectional view and plan view of reference numeral B in FIG. 5.
Figure 10:
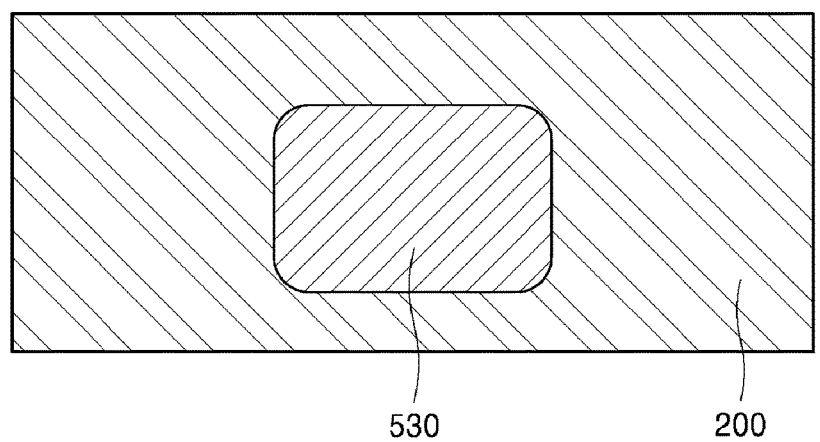

In some cases, the touch sensing electrode facing part 525 and the touch sensing electrode fixing unit 530 may form a structure in which they are closely disposed in a contactless manner. As described above, the bottom surface of the touch body main part 513 and one surface of the board 200 are configured to be very closely disposed. The touch sensing electrode fixing unit 530 formed on one surface of the board 200 has a very close distance from the touch sensing electrode facing part 525 formed on the bottom surface of the touch body main part 513, thereby being form specific electrical communication (refer to B of FIG. 5 and FIGS. 9 and 10).

In FIGS. 5 to 10, the touch sensing electrode facing part 525 and the touch sensing electrode fixing unit 530 have been illustrated as not coming into contact with each other, but they may be configured to come into contact with each other.

Figure 11:
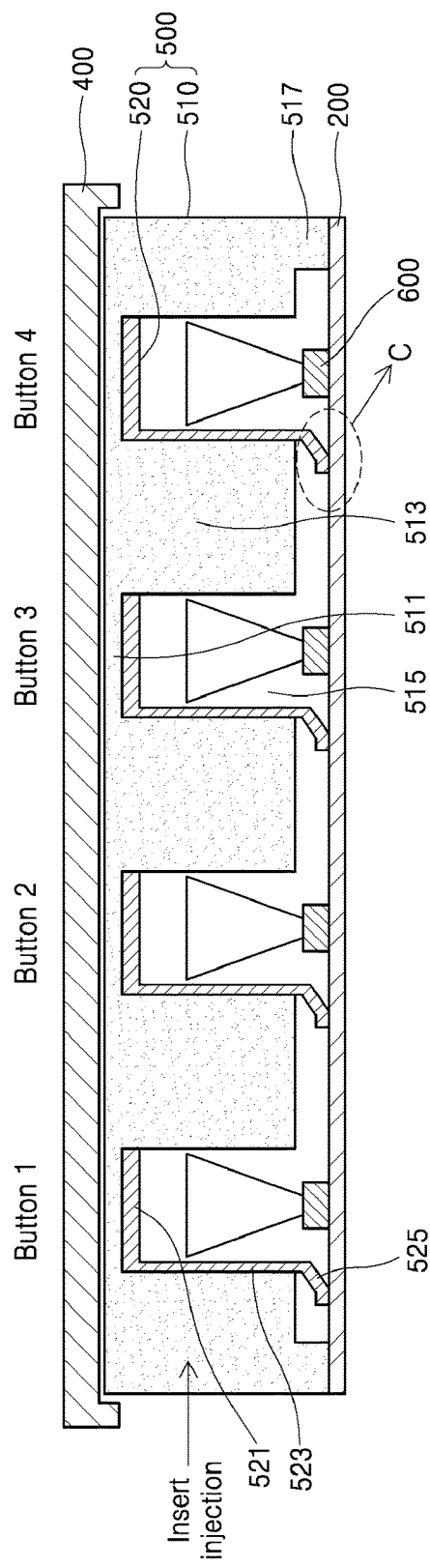
FIGS. 11 and 12 are a schematic partial side view of a modified example of the touch switch unit according to the present invention and a partially enlarged side cross-sectional view of reference numeral C.
Figure 12:
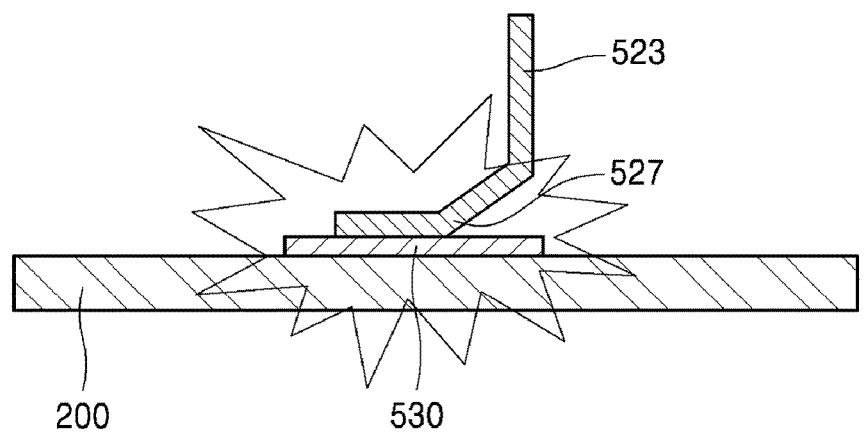

That is, as shown in FIGS. 11 and 12, the touch sensing electrode facing part 525 and the touch sensing electrode fixing unit 530 may a structure in which they come into contact with each other. As described above, the bottom surface of the touch body main part 513 and one surface of the board 200 are very closely disposed. In this case, a touch sensing electrode facing part 527 (refer to FIGS. 11 and 12) disposed on the bottom surface of the touch body main part 513 may have one end connected to the touch sensing electrode connection unit 523 and the other end form a physical contact with the touch sensing electrode fixing unit 530 formed on one surface of the board 200, thereby being capable of forming specific electrical communication.

Meanwhile, in the case of the aforementioned embodiment, the touch body space part 515 is formed in the touch body 510. The touch body space part 515 is disposed on the outside of the touch body main part 513 and partitioned by the touch body main part 513, and has one end open toward the board 200. When the light output unit 600 formed on one surface of the board 200 is driven at a location corresponding to the touch body space part 515, specific light is output to the outside through the touch body space part 515, the touch body top part 511 and the touch knob 400 so that a specific light radiation function is performed.

Figure 13:
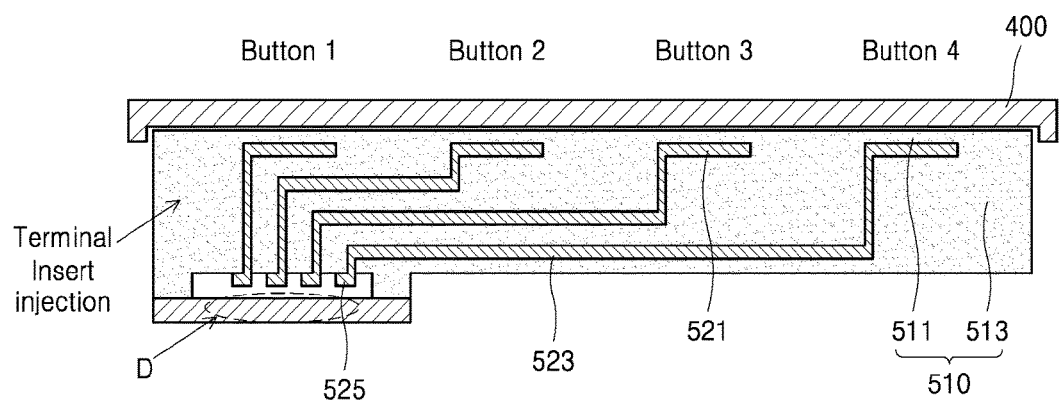
FIGS. 13 and 14 are a schematic partial side view and partial enlarged plan view of another modified example of the touch switch unit according to the present invention.
Figure 14:
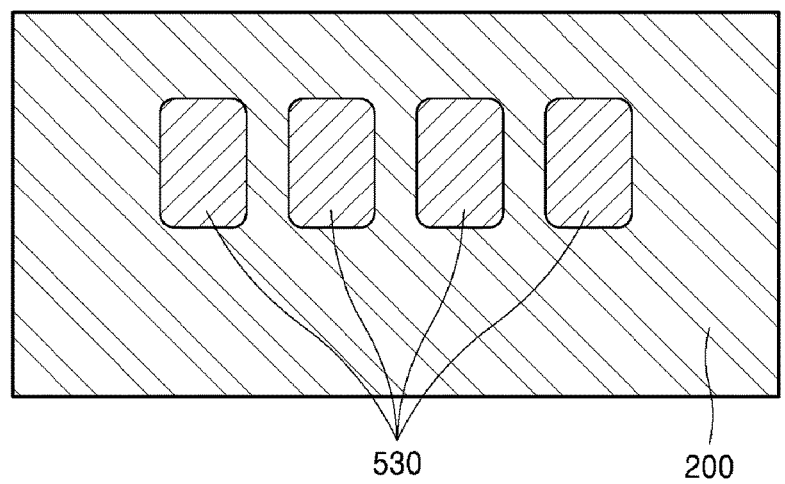
Figure 15:
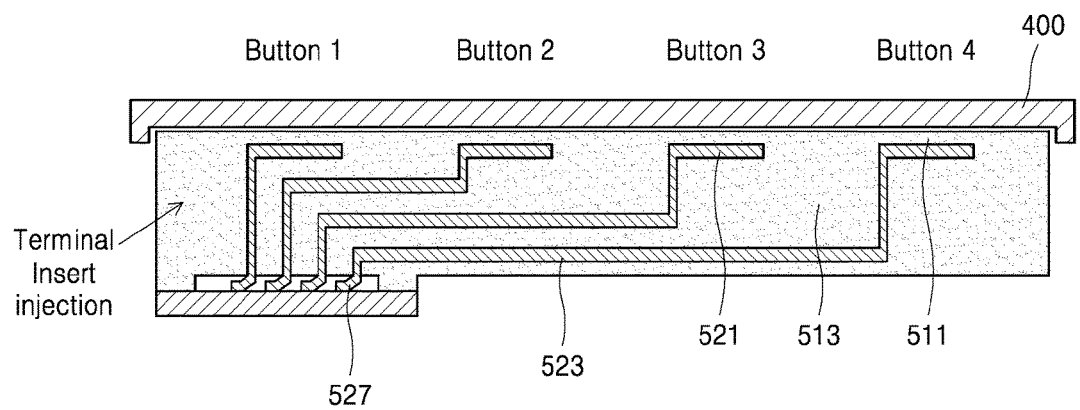
FIG. 15 is a schematic partial side cross-sectional view of a modified example of the touch switch unit according to the present invention.

In contrast, the touch body 510 may have a structure not including a separate touch body space part 515 (refer to FIGS. 13 to 15). In this case, the touch sensing electrode connection unit 513 may have a structure that connects the touch sensing electrode main part 521 and the touch sensing electrode facing part 525 between them. The touch sensing electrode connection unit 513 may be configured to be inserted into the touch body 510. As in the aforementioned case, the touch sensing electrode facing part 527 may directly physically come into contact with the touch sensing electrode fixing unit 530. That is, the end of the touch sensing electrode connection unit inserted into the touch body 510 may be configured to be concentrated and disposed on one side of the touch body.

Furthermore, if a plurality of touch functions is consecutively disposed, unlike in the touch sensing electrode main part spaced apart from the touch body top part at a specific interval, the touch sensing electrode facing part may be modified in various manners depending on the design specifications, such as that the touch sensing electrode facing part is concentrated and disposed on one side in order to minimize the area of the board (refer to FIGS. 13 to 15).

Furthermore, the touch switch unit according to the present invention may be applied to various switch devices used in a vehicle and may also be used in a device for the interior lighting of a vehicle.

Figure 4:
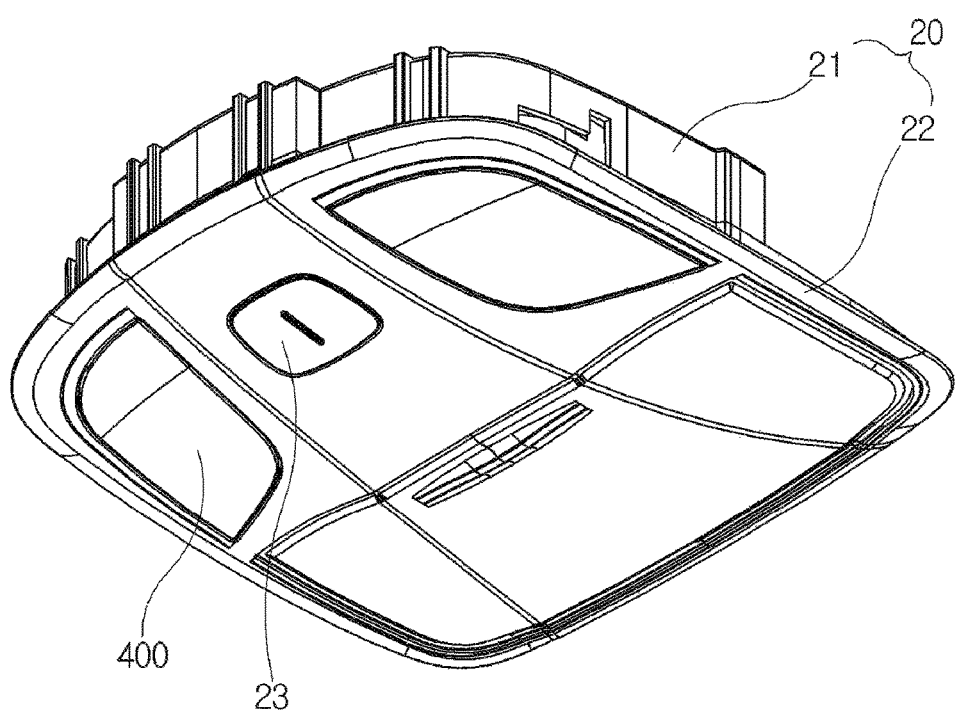
FIG. 4 is a schematic perspective view of an interior lighting apparatus for a vehicle including a touch switch unit according to the present invention.

That is, as shown in FIG. 4, the touch switch unit according to the present invention may be included in an interior lighting apparatus for a vehicle. The interior lighting apparatus 100 for a vehicle includes a housing 20 mounted on the interior of a vehicle. The housing 20 includes a housing body 21 and a housing cover 22 and form a specific internal space. The touch switch unit may be disposed in the specific internal space. Furthermore, a separate lighting device switch 23 for manipulating a specific function of the interior lighting apparatus for a vehicle, for example, a lighting function, such as adjusting the luminous intensity of lighting, may be further provided on one surface of the housing cover 22.

Furthermore, the touch knob 400 of the touch switch unit having the lighting function may be exposed through the exposed through hole of the housing cover 22. An electrical signal changed by a specific contact operation through the touch knob 400 is transferred to a specific controller through the board 200. A specific lighting power signal is applied in response to the electrical signal, and thus a specific output control signal to control the on/off of the light output unit 600 is transferred to the light output unit 600, thereby being capable of performing a specific lighting on/off function.

While the present invention has been described in connection with the exemplary embodiments illustrated in the drawings, they are merely illustrative and the invention is not limited to these embodiments. It will be appreciated by a person having an ordinary skill in the art that various equivalent modifications and variations of the embodiments can be made without departing from the spirit and scope of the present invention. Therefore, the true technical scope of the present invention should be defined by the technical sprit of the appended claims.

INDUSTRIAL APPLICABILITY

The touch switch unit according to the present invention may be used in various electronic devices in addition to a vehicle room lamp and may be modified in various manners.

The invention claimed is:

1. A touch switch unit, comprising:
a touch knob on which a touch by a user is performed;
a board spaced apart from the touch knob; and
a touch electrode body interposed between the board and the touch knob, for sensing a change in an electrical signal according to a touch on the touch knob,
wherein the touch electrode body comprises:
a touch body fixed on one surface of the board between the touch knob and the board, and
a touch sensing electrode having at least part extended to an area adjacent to the touch knob and an area adjacent to the board and formed on the touch body through insert injection and having at least another part formed on the board,
wherein the touch sensing electrode includes a touch sensing electrode main part having at least part of one surface thereof spaced apart from the touch knob and being adjacent to the touch knob toward the touch knob, wherein the touch sensing electrode main part receives a change in the electrical signal in a state in which a user has touched the touch knob,
wherein the touch sensing electrode main part has an upper surface that faces the touch knob, and a part of the touch body is disposed between the upper surface of the touch sensing electrode main part and the touch knob.

2. The touch switch unit of claim 1, wherein the touch sensing electrode further comprises:
a touch sensing electrode facing part adjacent to and spaced apart from the board in such a way as to be exposed toward the board,
a touch sensing electrode connection unit having one end connected to the touch sensing electrode main part and the other end connected to the touch sensing electrode facing part, and
a touch sensing electrode fixing unit formed on one surface of the board 200, for forming electrical communication with the touch sensing electrode facing part 525.

3. The touch switch unit of claim 2, wherein the touch sensing electrode facing part and the touch sensing electrode fixing unit are closely disposed in a contactless manner.

4. The touch switch unit of claim 2, wherein:
the touch sensing electrode facing part and the touch sensing electrode fixing unit form a mutual contact structure, and
one end of the touch sensing electrode facing part is connected to the touch sensing electrode connection unit and the other end of the touch sensing electrode facing part comes into contact with the touch sensing electrode fixing unit.

5. The touch switch unit of claim 2, wherein the touch body comprises:
a touch body top part disposed to face the touch knob,
a touch body main part disposed on one surface toward the board of the touch body top part and having a touch sensing electrode facing part disposed on the one surface toward the board, and
a touch body space part disposed outside the touch body main part, partitioned by the touch body main part and having one end open toward the board.

6. The touch switch unit of claim 5, further comprising a touch light output unit capable of outputting light toward the touch knob and disposed on one surface of the board toward the touch body space part.

7. The touch switch unit of claim 2, wherein:
the touch body comprises a touch body top part disposed to face the touch knob and a touch body main part disposed on one surface toward the board of the touch body top part, the touch body main part having a touch sensing electrode facing part being disposed on the one surface toward the board, and
the touch sensing electrode connection unit is disposed within the touch body.

8. An interior lighting apparatus for a vehicle comprising a touch switch unit, wherein the touch switch unit comprises:
a touch knob on which a touch by a user is performed;
a board spaced apart from the touch knob; and
a touch electrode body interposed between the board and the touch knob, for sensing a change in an electrical signal according to a touch on the touch knob,
wherein the touch electrode body comprises:
a touch body fixed on one surface of the board between the touch knob and the board, and
a touch sensing electrode having at least part extended to an area adjacent to the touch knob and an area adjacent to the board and formed on the touch body through insert injection and having at least another part formed on the board,
wherein the touch sensing electrode includes a touch sensing electrode main part having at least part of one surface thereof spaced apart from the touch knob and being adjacent to the touch knob toward the touch knob, wherein the touch sensing electrode main part receives a change in the electrical signal in a state in which a user has touched the touch knob,
wherein the touch sensing electrode main part has an upper surface that faces the touch knob, and a part of the touch body is disposed between the upper surface of the touch sensing electrode main part and the touch knob.

* * * * *